Aug. 2, 1966 W. B. GUGGI 3,264,564

VARIABLE IMPEDANCE DEVICE FOR TRANSISTOR AUTOMATIC GAIN CONTROL

Filed Feb. 7, 1963

INVENTOR.
WALTER B. GUGGI
BY
W. H. Sprague
ATTORNEY

3,264,564
VARIABLE IMPEDANCE DEVICE FOR TRANSISTOR AUTOMATIC GAIN CONTROL

Walter B. Guggi, Niederglatt, Zurich, Switzerland, assignor to Radio Corporation of America, a corporation of Delaware Filed Feb. 7, 1963, Ser. No. 256,846
5 Claims. (Cl. 325—411)

The present invention relates to a variable impedance device. More particularly the present invention relates to a transistorized variable imepdance device for use in automatic gain control circuits.

Automatic gain control (AGC) circuits are used in many fields, such as radio, television, radar, etc. These circuits generally provide automatic gain control for a receiver by feeding a signal taken from the output circuit back to the radio frequency (RF) and/or intermediate frequency (IF) stage. This feedback is generally negative feedback so that an increase in amplitude of the output signal is counteracted by a decrease in the amplification of the RF and/or IF stages.

The use of transistors for amplifier and AGC circuits has provided additional problems. If the amplification factor of the transistorized RF or IF amplifier is changed by adjusting the bias on the transistor, the amplifier's capacitance may be affected substantially more than the equivalent tube circuit and result in detuning of the amplifier stage. Also, for large signal levels cross modulation may result in the transistor. By using a circuit incorporating the principles of the present invention, it is possible to vary the effective gain of the amplifier without the above-mentioned disadvantageous despite large variations in the strength of the radio frequency signals intercepted by the antenna.

Accordingly, it is an object of the present invention to provide a new and improved transistorized variable impedance device for use in automatic gain control circuits.

A second object of the present invention is to provide apparatus for varying the effective gain of transistorized amplifiers without the adverse effects of distortion, detuning or cross modulation.

With the above objects in view the present invention mainly consists of a variable impedance device arranged in the feedback circuit between a source of automatic gain control signals and a transistorized amplifier. The variable impedance device includes a control transistor having its collector electrode capacitively coupled to the emitter electrode of the transistorized amplifier. The AGC signal is applied to the base electrode of the control transistor to vary the amount of emitter degeneration in the transistorized amplifier in accordance with the amplitude of the automatic gain cointrol signal.

The novel features that are considered characteristic of the present invention are set forth with particularity in the appended claims. The invention itself, however, both as to its organization and method of operation, as well as additional objects and advantages thereof, will best be understood from the following description when read in connection with the accompanying drawings in which:

Figure 1:
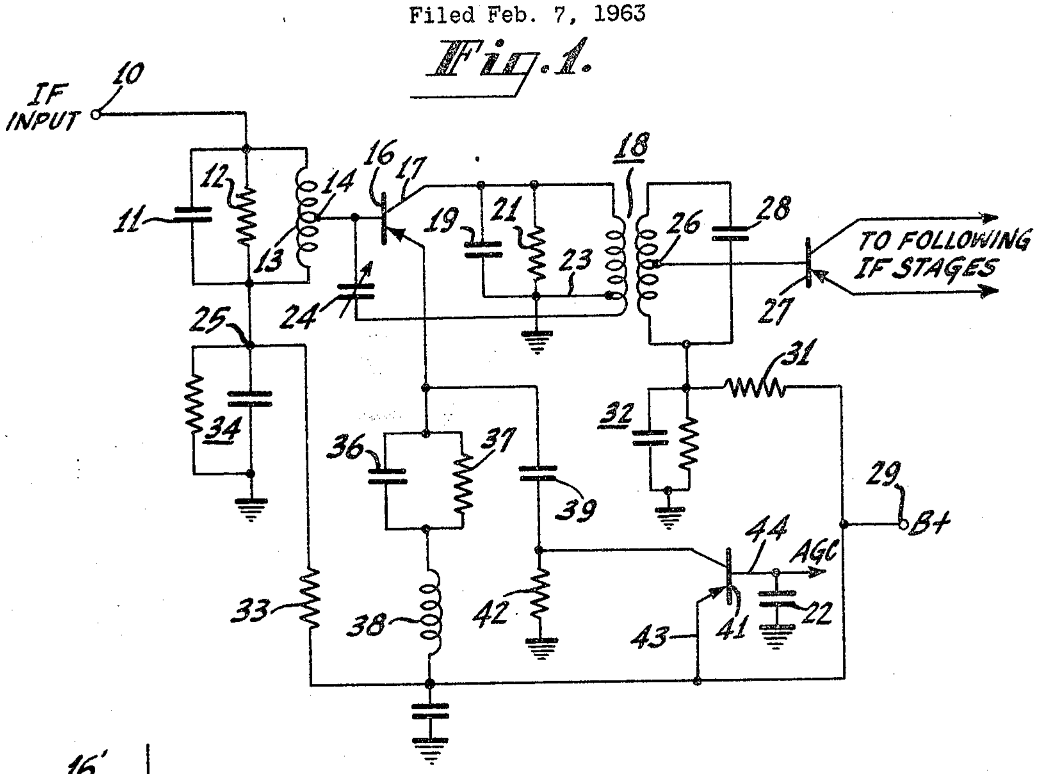
FIGURE 1 is a schematic circuit diagram showing one embodiment of the present invention connected in circuit with a transistorized IF amplifier in a television receiver.

Referring to the drawings and more particularly to FIGURE 1 it may be seen that the signal applied to the first IF amplifier stage is applied on input terminal 10. In accordance with conventional practice this signal for a television receiver would normally come from the output of the frequency converter stage.

The signals are applied to an IF trap composed of a parallel combination of capacitor 11, resistor 12 and inductor 13. The output from the trap is taken from a tap 14 of inductor 13 and applied to the base electrode of a transistor 16 which is the first IF amplifier transistor. The output from the transistor 16 is applied from its collector by means of a conductor 17 to an IF transformer 18. Connected in parallel with the primary winding of the transformer 18 and between the collector of transistor 16 and ground potential is a capacitor 19 and a resistor 21. To the primary of the transformer 18 is connected a conductor 23 which provides a feedback return by means of a variable capacitor 24 to the base electrode of the transistor 16.

The secondary winding of the IF transformer 18 has a tap 26 connected directly to the base electrode of a second IF amplifier transistor 27. Connected across the secondary winding of the transformer 18 is a capacitor 28. The IF amplifier may have several stages substantially identical with the first amplifier stage shown.

Operating bias for the transistor 27 is obtained from the positive terminal 29 of a direct current source which is not further illustrated in order to avoid unnecessarily complicating the drawing. The bias path from the terminal 29 to the base electrode of the transistor 27 includes a resistor 31 and a portion of the secondary winding of the transformer 18. Connected between the lower end of the secondary winding of transformer 18 and ground potential is the parallel combination 32 of a resistor and capacitor. In this instance ground potential represents the negative terminal of the source of operating potential.

Similarly the operating bias for the base electrode of the transistor 16 is obtained from the terminal 29 by means of a resistor 33 and a portion of the inductor 13. Connected between the lower end of inductor 13 and ground potential at junction point 25 is the parallel combination 34 of a resistor and capacitor.

The emitter electrode of the transistor 16 is connected to the positive terminal 29 by means of the parallel combination of a capacitor 36 and resistor 37 connected in series with an inductor 38.

The emitter of the transistor 16 is coupled by means of the capacitor 39 to the collector electrode of the control transistor 41. This collector is also connected to ground potential by means of a resistor 42. The emitter electrode of transistor 41 is connected directly by conductor 43 to the positive terminal 29 while the base electrode thereof has the automatic gain control signal applied thereto. In a television receiver this automatic gain control signal is generally obtained from the output of the video amplifier. The base electrode of transistor 41 is shown bypassed to ground by capacitor 22.

In operation, the desired IF signal (45.75 megacycles for example) contained in the signals applied to the input terminal 10 is amplified by the IF amplifier transistors 16 and 27 and any succeeding stages of IF amplification that may be present in the television receiver. The IF transformer as well as the remaining components contained in the IF amplifier stages are selected to resonate at the desired IF frequency and selectively amplify signals of this frequency while substantially attenuating all others. The amplified signal from the last IF amplifier stage is applied in a known manner to the video amplifiers (not illustrated) and from there to the television kinescope for reproduction purposes. The automatic gain control signal is obtained from a video amplifier stage and is fed back to the IF amplifier.

In accordance with the illustrated embodiment, these automatic gain control signals are applied on conductor 44 to the base electrode of the transistor 41 to effectively change the resistance of the collector-emitter circuit of transistor 41. This in turn changes the RF impedance in the emitter circuit of the transistor 16. Accordingly, the amount of emitter degeneration of the transistor 16 is effectively regulated and changes the amplification factor of the transistor 16 without effectively changing its capacitance.

If the input signal to the IF amplifier increases, the resulting AGC feedback signal increases the amount of emitter degeneration and substantially reduces any adverse effects of cross modulation.

In the circuit illustrated in FIGURE 1, the inductor 38 provides a high series impedance in the emitter circuit of the transistor 16 at the operating IF frequency. Thus, a high degree of A.-C. signal attenuation and a relatively low D.C. attenuation, as compared to the attenuation provided by resistor 37, is provided by inductor 38 permitting the selection of the D.C. operating point of the transistor 16 independently of impedance requirements related to application of the feedback control signal. Also the collector of the transistor 41 is provided with a direct current bias by means of the resistor 42. Therefore, the transistor 41 may be operated at the point of its operating characteristic which is most favorable for the intended purpose. This can provide better regulating characteristics since variations due to undesirable small signal parameters can be avoided.

An advantage of using the control transistor circuit shown in FIGURE 1 is that a relatively low quality RF type transistor may be used as long as its collector capacitance is sufficiently low.

Figure 2:
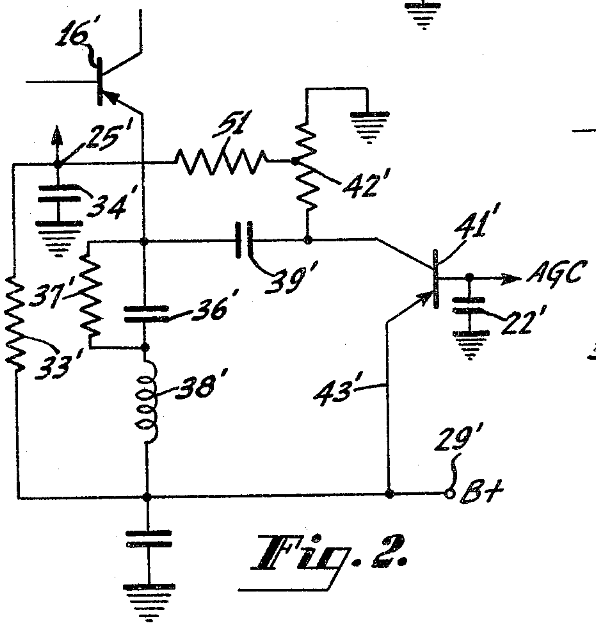
FIGURE 2 is a schematic circuit diagram of a second embodiment.

For certain applications, for example, in very narrow band IF amplifiers, where detuning due to transistor impedance becomes very critical, compensation can be achieved by using the circuit of FIGURE 2.

Referring to FIGURE 2, the transistor 16' is comparable to transistor 16 of FIGURE 1 and is connected in the same manner in the IF amplifier stage. Similarly, control transistor 41' is comparable to transistor 41. The emitter of the transistor 16' is connected to the positive terminal 29' of the source of direct current potential by means of resistor 37' and inductor 38'. As in FIGURE 1, capacitor 36' is connected in parallel with resistor 37'.

Coupled between the collector electrode of transistor 41' and the emitter electrode of transistor 16' is the capacitor 39'. The collector electrode of transistor 41' is connected directly to ground potential by the resistor 42'. Unlike FIGURE 1 resistor 42' has a tapped portion which is connected to the junction point 25' by means of resistor 51. Junction point 25' is bypassed to ground by capacitor 34' and is connected to the positive terminal 29' by resistor 33'. Also, junction point 25' is connected to the lower end of the winding 13 of FIGURE 1 in the same manner as point 25 of FIGURE 1.

The emitter electrode of transistor 41' is connected directly to the positive terminal 29' by means of a conductor 43'. The base of transistor 41' is bypassed to ground by capacitor 22'.

In operation, A.C. coupling is now provided between the collector of the transistor 41' and the emitter of transistor 16' and D.C. bias coupling is provided between the collector of transistor 41' and the base of transistor 16'. Thus the operating point of transistor 16' may be regulated simultaneously with the feedback control. Depending on the D.C. bias, the operating point of transistor 16' can be moved up or down along its characteristic at the same time that the AGC signal is fed back. Not only will this arrangement of FIGURE 2 compensate for circuit detuning where critical narrow band amplifiers are utilized but it will also permit very large amounts of regulation.

Other forms of feedback control may be carried out utilizing the principles disclosed herein. For example, in FIGURE 3, an arrangement is shown wherein a control transistor 41'' is not operating with a grounded emitter connection. In this embodiment the emitter of the control transistor 41'' is connected by the parallel arrangement of a capacitor 61 and resistor 62 to the terminal 29'' which is the positive terminal of the source of the direct current potential.

The collector electrode of transistor 41'' is capacitively coupled to the emitter of transistor 16'' by means of the capacitor 39'' and is connected to ground potential by a resistor 42''. The emitter of transistor 16'' is connected by means of the parallel combination of the resistor 37'' and capacitor 36'' in series with the inductor 38'' to terminal 29''. The base of transistor 41'' is bypassed to ground by capacitor 22''. As before, transistor 16'' is connected in the IF amplifier stages in the same manner as transistor 16 of FIGURE 1.

Figure 3:
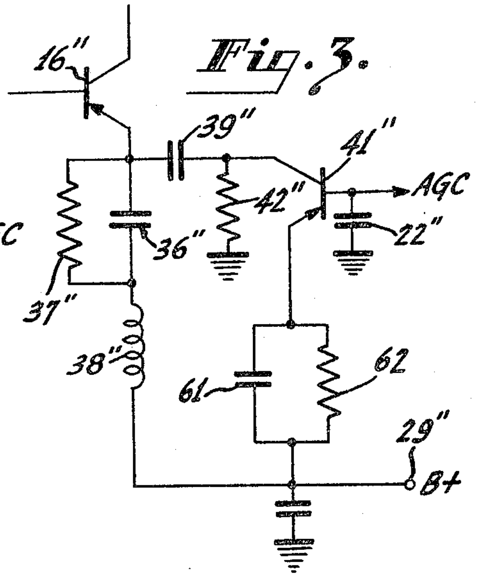
FIGURE 3 is a schematic circuit diagram of a third embodiment.

The arrangement of FIGURE 3 is provided to indicate that control of the IF amplifier stage may be effected in whatever configuration is most suitable to provide the necessary impedance change within the emitter circuit of transistor 16. For example, configurations such as emitter connections which are RF grounded and collector connections which are D.C. grounded may be utilized to provide a relatively high impedance AGC signal and at the same time provide the best RF regulation.

While the illustrated embodiments have been described with respect to a variable impedance device as used in the feedback circuit between a source of automatic control signals and an intermediate frequency amplifier of a transistorized television receiver, it is clear that the same principles may be applied to radio-frequency amplifiers in television, radio and radar receivers.

What is claimed is:

1. In an automatic gain control circuit for a transistorized television receiver in combination,
   - an intermediate frequency amplifier stage having a first transistor with base, emitter and collector electrodes, said first transistor being adapted to have intermediate frequency signals applied thereto for amplification purposes;
   - a control transistor having base, emitter and collector electrodes and adapted to have automatic gain control signals applied to said base electrode thereof;
   - capacitive coupling means connected between the collector-emitter circuit of said control transistor and the collector-emitter circuit of said first transistor for providing substantially only alternating current coupling between said circuits;
   - direct current biasing means coupled to said collector electrode of said control transistor;
   - a source of biasing potential coupled to said transistors and means for applying automatic gain control signals to said base electrode of said control transistor to vary the impedance thereof and thereby vary substantially only the alternating current load impedance and the signal amplification factor of said first transistor substantially without variation in the direct current bias applied to said first transistor whereby said signal amplification factor of said first transistor is varied substantially without changing the capacitance and the tuning of said intermediate frequency amplifier stage.

2. In an automatic gain control circuit for a transistorized television receiver in combination,
   - an intermediate frequency amplifier stage having a first transistor with base, emitter and collector electrodes, said first transistor being adapted to have intermediate frequency signals applied thereto;
   - a source of operating potential for said transistor;
   - impedance means connected in circuit with said source and with the collector-emitter circuit of said first transistor having a relatively low direct current impedance and a relatively high impedance at IF frequencies;

a control transistor having base, emitter and collector electrodes, said base electrode of said control transistor being adapted to have television receiver automatic gain control signals applied thereto;

and capacitive means for providing substantially only alternating current coupling between said collector electrode of said control transistor and said emitter electrode of said first transistor, said control transistor being coupled to said source of operating potential for selecting the operating characteristic thereof so that upon application of automatic gain control potentials to said base electrode of said control transistor, the collector-emitter impedance of said control transistor and hence substantially only the alternating current load impedance on said emitter electrode of said first transistor changes to compensate the intermediate frequency signal gain of said first transistor substantially without changing bias, capacitance or tuning thereof.

3. Apparatus as claimed in claim 2 wherein said impedance means is an inductor.

4. A transistor automatic gain control circuit comprising:

an amplifier transistor having base, emitter and collector electrodes and being adapted for amplification of alternating current signals, the series combination of a direct current biasing impedance and an alternating current load impedance coupled between said emitter and collector electrodes, said alernating current load exhibiting a direct current impedance less than that of said biasing impedance and an alternating current impedance, at operating frequencies of said circuit, substantially greater than that of said biasing impedance;

a control transistor having base, emitter and collector electrodes;

capacitive means for providing substantially only alternating current coupling between the emitter-collector circuit of said control transistor and said alternating current load impedance;

and means for applying automatic gain control potential to said control transistor to vary the collector-emitter impedance thereof and thereby vary substantially only the alternating current load impedance and signal amplification factor of said amplifier transistor substantially without varying the direct current bias, capacitance or tuning of said amplifier transistor.

5. Apparatus as claimed in claim 4 wherein the amplifier transistor is a television receiver intermediate frequency amplifier and has impedance means connected in circuit with its emitter electrode, said impedance means having a substantial impedance at intermediate frequencies.

References Cited by the Examiner

UNITED STATES PATENTS

| | | | |
|---|---|---|---|
| 2,429,513 | 10/1947 | Hansen et al. | 325—400 XR |
| 3,002,909 | 9/1961 | Hirsch | 325—413 XR |

KATHLEEN H. CLAFFY, *Primary Examiner.*

R. S. BELL, *Assistant Examiner.*